(12) United States Patent
Maleville

(10) Patent No.: US 7,749,908 B2
(45) Date of Patent: Jul. 6, 2010

(54) EDGE REMOVAL OF SILICON-ON-INSULATOR TRANSFER WAFER

(75) Inventor: Christophe Maleville, Bernin (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 145 days.

(21) Appl. No.: 12/177,752

(22) Filed: Jul. 22, 2008

(65) Prior Publication Data

US 2009/0061545 A1    Mar. 5, 2009

Related U.S. Application Data

(63) Continuation of application No. 10/998,289, filed on Nov. 26, 2004, now Pat. No. 7,402,520.

(51) Int. Cl.
*H01L 21/302* (2006.01)
*H01L 21/461* (2006.01)

(52) U.S. Cl. .......... 438/692; 257/E21.23; 257/E21.304; 438/690; 438/691

(58) Field of Classification Search ................ 438/690, 438/691, 592; 257/E21.23, E21.304
See application file for complete search history.

(56) References Cited

U.S. PATENT DOCUMENTS

| | | | |
|---|---|---|---|
| 4,721,548 A | 1/1988 | Morimoto | |
| 5,354,715 A | 10/1994 | Wang et al. | |
| 5,374,564 A | 12/1994 | Bruel | 437/24 |
| 5,429,711 A | 7/1995 | Watanabe et al. | |
| 5,700,179 A | 12/1997 | Hasegawa et al. | |
| 5,770,465 A | 6/1998 | MacDonald et al. | 437/67 |
| 5,800,725 A | 9/1998 | Kato et al. | |
| 5,821,166 A | 10/1998 | Hajime et al. | |
| 5,854,123 A | 12/1998 | Sato et al. | 438/507 |
| 5,920,764 A | 7/1999 | Hanson et al. | |
| 5,942,445 A | 8/1999 | Kato et al. | |
| 5,951,374 A | 9/1999 | Kato et al. | |
| 5,966,620 A | 10/1999 | Sakaguchi et al. | 438/455 |
| 5,985,742 A | 11/1999 | Henley et al. | 438/515 |

(Continued)

FOREIGN PATENT DOCUMENTS

EP    0 971 395    1/2000

(Continued)

OTHER PUBLICATIONS

European Search Report, EP 08 02 2218, dated Mar. 20, 2009.

(Continued)

*Primary Examiner*—Asok K Sarkar
(74) *Attorney, Agent, or Firm*—Winston & Strawn LLP

(57) ABSTRACT

A silicon-on-insulator transfer wafer having a front surface with a circumferential lip around a circular recess is polished. In one version, the circular recess on the front surface of the wafer is masked by filling the recess with spin-on-glass. The front surface of the wafer is exposed to an etchant to preferentially etch away the circumferential lip, while the circular recess is masked by the spin-on-glass. The spin-on glass is removed, and the front surface of the transfer wafer is polished. Other methods of removing the circumferential lip include applying a higher pressure to the circumferential lip in a polishing process, and directing a pressurized fluid jet at the base of the circumferential lip.

14 Claims, 6 Drawing Sheets

U.S. PATENT DOCUMENTS

| | | | |
|---|---|---|---|
| 5,994,207 A | 11/1999 | Henley et al. | 438/515 |
| 6,010,579 A | 1/2000 | Henley et al. | 148/33.2 |
| 6,013,563 A | 1/2000 | Henley et al. | 438/458 |
| 6,013,567 A | 1/2000 | Henley et al. | 438/515 |
| 6,033,974 A | 3/2000 | Henley et al. | 438/526 |
| 6,048,411 A | 4/2000 | Henley et al. | 148/33.5 |
| 6,054,363 A | 4/2000 | Sakaguchi et al. | 438/406 |
| 6,146,979 A | 11/2000 | Henley et al. | 438/458 |
| 6,155,909 A | 12/2000 | Henley et al. | 451/39 |
| 6,159,824 A | 12/2000 | Henley et al. | 438/455 |
| 6,159,825 A | 12/2000 | Henley et al. | 438/460 |
| 6,162,705 A | 12/2000 | Henley et al. | 438/478 |
| 6,221,774 B1 | 4/2001 | Malik | |
| 6,248,667 B1 | 6/2001 | Kim et al. | |
| 6,276,997 B1 | 8/2001 | Li | |
| 6,284,628 B1 | 9/2001 | Kuwahara et al. | 438/459 |
| 6,284,629 B1 | 9/2001 | Yokokawa et al. | 438/459 |
| 6,335,264 B1 | 1/2002 | Henley et al. | 438/460 |
| 6,337,241 B1 | 1/2002 | Aoki | 438/243 |
| 6,372,609 B1 | 4/2002 | Aga et al. | |
| 6,376,378 B1 | 4/2002 | Chen et al. | |
| 6,387,809 B2 | 5/2002 | Toyama | |
| 6,426,270 B1 | 7/2002 | Sakaguchi et al. | 438/406 |
| 6,448,152 B1 | 9/2002 | Henley et al. | 438/458 |
| 6,458,688 B1 | 10/2002 | Wenski et al. | 438/626 |
| 6,468,923 B1 | 10/2002 | Yonehara et al. | 438/761 |
| 6,530,826 B2 | 3/2003 | Wenski et al. | 451/41 |
| 6,596,610 B1 | 7/2003 | Kuwabara et al. | |
| 6,613,676 B1 | 9/2003 | Yonehara et al. | |
| 7,022,586 B2 | 4/2006 | Maleville et al. | |
| 7,402,520 B2 | 7/2008 | Donohoe et al. | 438/690 |
| 2001/0029072 A1 | 10/2001 | Kuwabara et al. | 438/151 |
| 2001/0039101 A1 | 11/2001 | Wenski | 438/471 |
| 2002/0081823 A1 | 6/2002 | Cheung et al. | 438/455 |
| 2002/0164876 A1 | 11/2002 | Walitzki et al. | 438/692 |
| 2003/0219957 A1 | 11/2003 | Kuwabara et al. | 438/400 |
| 2004/0112866 A1 | 6/2004 | Maleville et al. | 216/83 |
| 2005/0070071 A1 | 3/2005 | Henley et al. | 438/459 |
| 2006/0115986 A1 | 6/2006 | Donohoe et al. | 438/690 |
| 2006/0141747 A1 | 6/2006 | Henley et al. | 438/455 |
| 2008/0124929 A1 | 5/2008 | Okuda et al. | 438/692 |
| 2008/0124930 A1 | 5/2008 | Lim et al. | 438/692 |
| 2008/0138987 A1 | 6/2008 | Donohoe et al. | 438/690 |

FOREIGN PATENT DOCUMENTS

| | | |
|---|---|---|
| EP | 1156531 | 11/2001 |
| EP | 1427001 | 6/2004 |
| FR | 2794891 | 12/2000 |
| JP | 11297583 | 10/1999 |
| JP | 2005072070 | 3/2005 |
| JP | 2005072071 | 3/2005 |
| WO | WO 2004/010494 | 1/2004 |
| WO | WO 2007/007537 | 1/2007 |
| WO | WO 2008/007508 | 1/2008 |

OTHER PUBLICATIONS

European Search Report, EP 05257236, dated Mar. 19, 2009.

Abe, Takao, "Wafering Technologies", Electrochemical Society Proceedings, vol. 97, No. 3, pp. 123-133.

Auberton-Hervé, A.J. et al., "Soitec Presentation—Sematech PTAB Meeting", Apr. 1998.

Auberton-Hervé, A.J. et al., "Smart Cut Technology: Industrial Status of SOI Wafer Production and New Material Developments", Ninth International Symposium on Silicon-on-Insulator Technology, May 1999.

Bruel, M., "Silicon on Insulator Material Technology", Electronic Letters, vol. 31, No. 14, pp. 1201-1201, 1995.

Mitani, Kiyoshi, "Technical Challenges in High Volume Unibond® SOI Wafter Manufacturing", SOI Seminar, 1998.

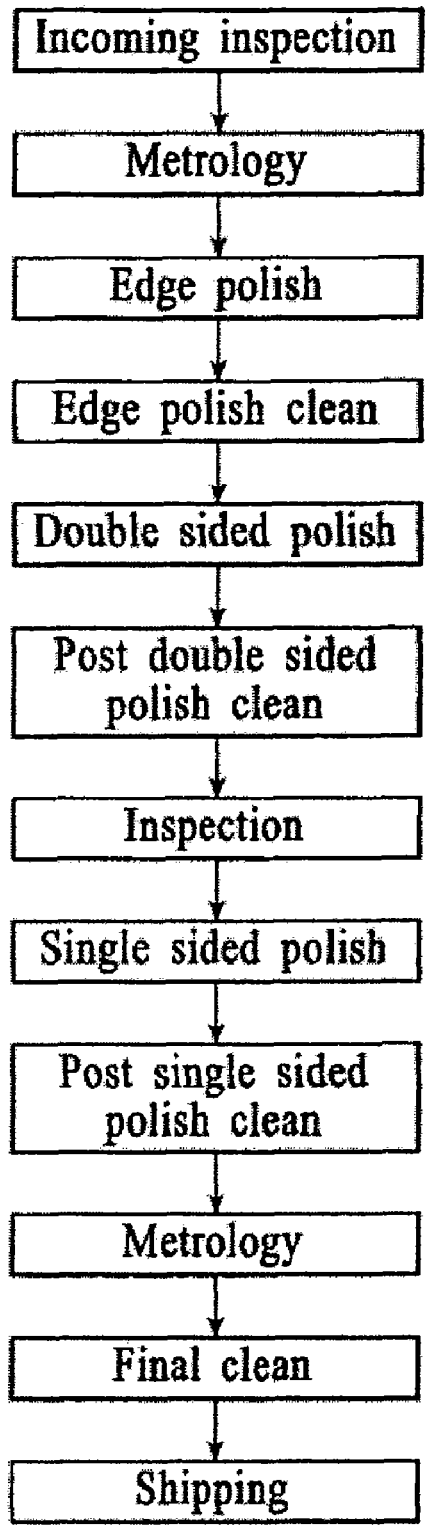
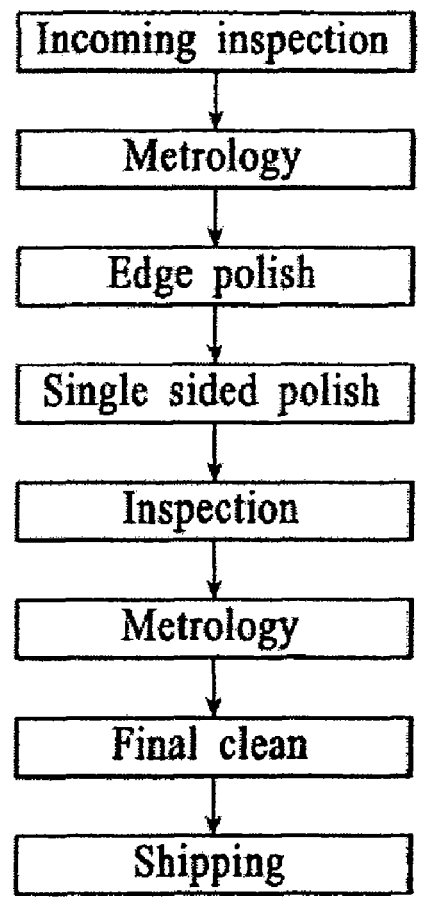
FIG.8A
FIG.8B

EDGE REMOVAL OF SILICON-ON-INSULATOR TRANSFER WAFER

CROSS-REFERENCES TO RELATED APPLICATIONS

This application is a continuation of U.S. patent application Ser. No. 10/998,289, filed Nov. 26, 2004, entitled "Edge removal of silicon-on-insulator transfer wafer," the content of which is hereby incorporated by reference in its entirety.

BACKGROUND OF THE INVENTION

Embodiments of the present invention relate to polishing and refurbishing a silicon-on-insulator transfer wafer.

In the fabrication of semiconductor devices, substrates are processed by forming or etching material on the substrates. An example of a substrate process is a process to form a silicon-on-insulator (SOI) structure on a production substrate, the SOI structure comprising a silicon layer overlying an insulator layer, which is typically an oxide layer. In one version of a SOI formation process, an oxide layer is formed on the surface of a first silicon wafer, and the surface is pressed against and bonded to a second silicon wafer surface. The bonded wafers can be heat treated to strengthen the bond attachment. The exposed surface of one or more of the wafers is then ground away to leave a thin silicon layer overlying an oxide layer on a silicon substrate. However, this process is often undesirably inefficient, as mechanical grinding or etching of the wafer can take an unsuitably long time. The process can also be costly, as a substantial amount of silicon material is wasted in the grinding process, and a fresh silicon substrate is typically required for each new process.

In an improved SOI transfer process, a SOI structure is transferred onto a production wafer from a transfer wafer by bonding the transfer wafer and production wafer together, and then de-laminating the transfer wafer from the production wafer to form the SOI structure. The SOI transfer wafer can comprise a silicon material such as a silicon wafer or silicon layer, which is implanted with ions, and an overlying thermally grown silicon oxide layer. In one version, the transfer wafer comprises a surface layer of epitaxially grown silicon which is implanted with ions, and covered with a layer of silicon oxide. The surface of the silicon oxide layer on the transfer wafer is contacted with a surface of a production wafer, which is typically a bare silicon wafer, and the wafers are adhered to one another. A subsequent de-lamination step is performed to cleave or de-laminate the transfer wafer from the production wafer at the ion-implanted layer, leaving the oxide layer and a portion of the remaining silicon material bonded to the production wafer to provide the SOI structure.

The de-laminated transfer wafer typically has a remaining portion of the silicon material, on which an oxide layer can be re-formed to perform additional SOI transfer processes. However, because the periphery of the transfer and production wafer are typically not bonded as strongly as the central region, a circumferential lip often forms about the periphery of the transfer wafer after the delamination process. The circumferential lip comprises un-transferred portions of the silicon material, as well as residual oxide insulator material. Such a circumferential lip is undesirable because it impedes surface contact between the transfer and production wafers, and limits the ability of the transfer wafer to be re-used for subsequent SOI processes. Accordingly, it is desirable to have a method of refurbishing a transfer wafer to permit transfer of SOI layers onto a plurality of subsequent wafers.

In one version, the transfer wafer is refurbished by performing a double-sided polishing step, such as by chemically mechanically polishing the wafer, to remove remaining oxide material from both sides of the wafer and polish away the circumferential lip. In yet another version described in U.S. Pat. No. 6,284,628 to Kuwahara et al, issued on Sep. 4, 2001 and assigned to Shin-Etsu Handotal Co., Ltd., which is herein incorporated by reference in its entirety, an overlying oxide layer is removed by a chemical etching step. Afterwards, the smaller step remaining on the wafer is removed by polishing the surface of the wafer just slightly, by inserting the wafer between polishing turn tables.

However, such double-sided polishing methods can be inefficient, often fail to remove all of the circumferential lip, and can require an undesirably long polishing time, for example, a double-sided polish process may only remove about ½ a micron/minute of material. The procedures can also be expensive due to the quantity of slurry and other consumable chemical mechanical polishing pads required. Also, conventional polishing procedures may remove an undesirably large amount of the silicon layer from the transfer wafer to remove the circumferential lip, reducing the number of times the transfer substrate can be used. Conversely, if the transfer wafer is underpolished, a small circumferential bumper ring, typically having a height of around 200 nm, can remain on the wafer. The remaining bumper lip can impede contact between the transfer wafer and a production wafer, and reduce the quality of the SOI transfer process. For example, for recycled transfer wafers having a circumferential bumper with a height of about 50 nm, the SOI transfer yield may be reduced by about 20% over fresh transfer wafers having planar surfaces. Overpolishing of the circumferential lip with respect to the rest of the wafer can result in edge roll-off wafer surface topography, which also reduces SOI transfer yields.

Accordingly, it is desirable to recycle and reclaim a SOI transfer wafer to re-use the transfer substrate. It is furthermore desirable to reclaim a SOI transfer wafer to provide a transfer wafer that is substantially absent a circumferential lip, to provide a substantially planar contact surface.

SUMMARY OF THE INVENTION

A method of polishing a silicon-on-insulator transfer wafer having a front surface with a circumferential lip around a circular recess, involves masking the circular recess on the front surface of the wafer by filling the recess with spin-on-glass. The front surface of the wafer is exposed to an etchant to preferentially etch away the circumferential lip, as the circular recess is masked by the spin-on-glass. The spin-on-glass is removed, and the front surface of the transfer wafer is further polished.

In another version, the front surface of a silicon-on-insulator transfer wafer is ground with particulates having a mesh size of from about 2000 to about 8000, and then etched. The back surface of the transfer wafer is etched to remove the oxide layer, and the front surface of the wafer is further polished.

In yet another version, the front surface of a silicon-on-insulator transfer wafer is exposed to an etchant solution having a composition capable of preferentially etching away the implanted circumferential lip relative to etching at the circular recess. Following exposure to the etchant solution, the front surface of the transfer wafer is polished.

In a further version, the circumferential lip on the front surface of the transfer wafer is ground off substantially without grinding the circular recess. The front surface of the transfer wafer is then polished.

In yet another version, the transfer wafer is rotated against a polishing pad having an edge while a polishing slurry is applied between the transfer wafer and polishing pad. The edge of the polishing pad is maintained at a higher pressure against the circumferential lip of the transfer wafer relative to a pressure maintained at the circular recess, so that the pad preferentially polishes off the circumferential lip of the transfer wafer.

In still another method, a fluid jet is directed at an angle toward a base of the circumferential lip of the transfer wafer, to etch away the circumferential lip. The front surface of the transfer wafer is then polished.

BRIEF DESCRIPTION OF THE DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

FIG. 7b is a partially exploded perspective view of the chemical mechanical polisher of FIG. 7a;

FIG. 8a is a flow chart illustrating an embodiment of a refurbishment process having a double-sided polishing step; and FIG. 8b is a flow chart illustrating an embodiment of a refurbishment process with a single-sided polishing step.

DETAILED DESCRIPTION OF THE INVENTION

Figure 1A:
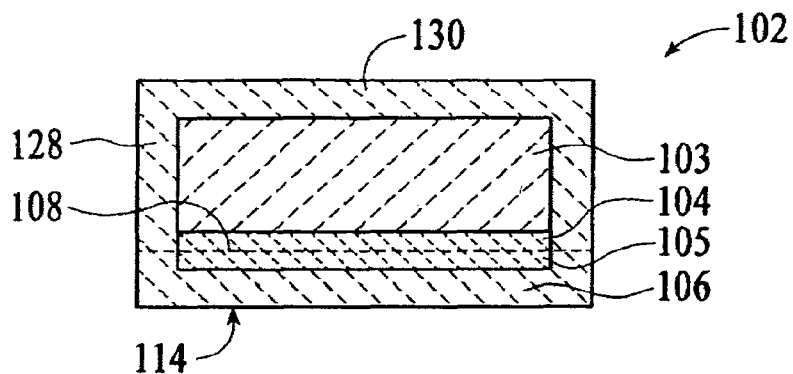
FIG. 1a is a sectional side view of an embodiment of a SOI transfer wafer having an insulator layer over a silicon material.

An example of a transfer wafer 102 suitable for use in a layer transfer process, such as a silicon-on-insulator (SOI) transfer process, is shown in FIG. 1a. For a SOI transfer process, the transfer wafer 102 comprises a silicon material 105, such as for example a silicon wafer 103. The transfer wafer 102 may also comprise a silicon material 105 comprising a surface layer 104 of silicon, such as surface layer 104 of silicon that is epitaxially grown on the silicon wafer 103, as shown for example in FIG. 1a. An insulator layer 106 is formed over a surface 107 of the silicon material 105. For example, the insulator layer 106 may be formed over an epitaxially grown silicon layer 104, as shown for example in FIG. 1a, or may alternatively be formed directly over a surface 107 of a bare silicon wafer 103, as shown for example in FIG. 2a. The insulator layer 106 can comprise silicon oxide, and may also comprise other insulator materials such as at least one of $Al_2O_3$, AlN, SiC, and $Si_3N_4$. An ion-implanted layer 108 is formed at a desired depth d in the silicon material 105 by ion-implanting hydrogen or other ions, such as oxygen ions, into the silicon material 105. The ion-implanted layer 108 may also be sloped at the periphery of the wafer 102 due to beveling of the wafer 102, as shown for example in FIG. 2a. While the present embodiment is described in terms of a transfer wafer 102 having a silicon material 105 below an insulator layer 106, it should be understood that it may be desirable to similarly transfer other layer structures, such as for example a germanium-on-insulator structure, and thus the invention should not be limited to the transfer of silicon-on-insulator structures only.

Figure 1B:
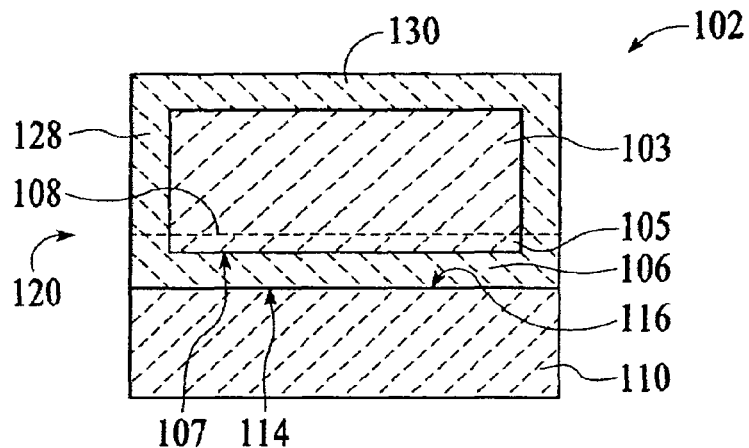
FIG. 1b is a sectional side view of the transfer wafer of FIG. 1a, attached to a production wafer during a SOI transfer process.

The SOI transfer process typically comprises contacting a front surface 114 of the transfer wafer 102 with a surface 116 of a production wafer 110, as shown for example in FIG. 1b. The production wafer 110 can be a silicon wafer, such as for example a polished bare silicon wafer, or may comprise other materials such as germanium. In one version, an insulator layer such as a silicon oxide layer may be formed at the surface 116 of the production wafer 110 (not shown), either instead of or in addition to the insulator layer 106 on the transfer wafer 102. The contacting wafer surfaces 114, 116 bond together to form a silicon-on-insulator structure 120 comprising a layer of the silicon material 105 over the insulator layer 106 on the production wafer 110.

Figure 1C:
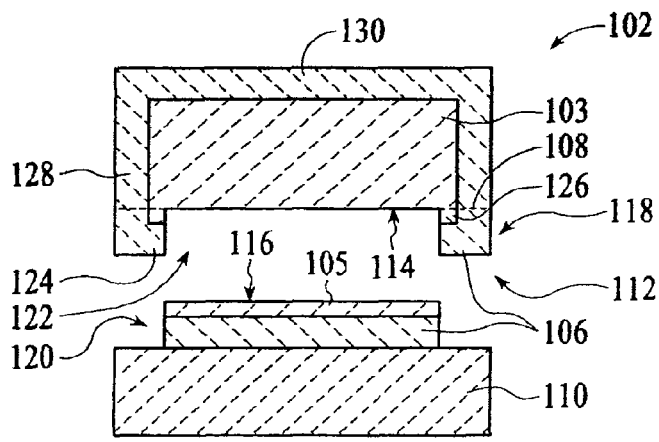
FIG. 1c is a sectional side view of the transfer and production wafers of FIG. 1b after de-lamination of the transfer wafer from the production wafer, the de-laminated transfer wafer having a circumferential lip, and the production wafer having a SOI structure.

The transfer wafer 102 is delaminated from the production wafer 110 to form the silicon-on-insulator structure 120 remaining on the production wafer 110, as shown for example in FIG. 1c. The transfer wafer 102 can be de-laminated or cleaved from the production wafer 110 by activating the ion implanted layer 108, which delaminates the portion of the transfer wafer 102 above the layer 108. In one version, the ion implanted layer 108 is activated by heating the bonded transfer and production wafers 102, 110 to a temperature of at least about 1000° C., which alters the crystal structure at the ion-implanted layer 108 to de-laminate the transfer wafer 102 from the production wafer 110 at the ion-implanted layer 108. Once the transfer wafer 102 has been removed, the remaining silicon-on-insulator structure 102 comprising the transferred silicon material 105 and insulator layer 106 can be further treated, for example by heat treating and polishing, as described for example in U.S. Pat. No. 6,284,628 to Kuwahara et al, published on Sep. 4, 2001 and assigned to Shin-Etsu Handotal Co., Ltd., which is herein incorporated by reference in its entirety.

The de-laminated transfer wafer 102 typically comprises the remaining silicon material 105 that lay previously behind the ion-implanted layer 108. Furthermore, as the edges 118 of the transfer wafer 102 typically do not bond strongly to the production wafer 110, the de-laminated transfer wafer 102 also typically comprises an attached circumferential lip 112 about a circular recess 122 comprising remaining silicon material 105. The circumferential lip 112 can comprise the peripheral insulator material 106 and silicon material 105 above the ion-implanted layer 108 that remain bonded to the transfer wafer 112. For example, the silicon step 126 can comprise remaining, non-transferred silicon wafer material, as shown for example in FIG. 2a. Alternatively, the silicon step 126 can comprise silicon material remaining from an epitaxially grown silicon layer 104 formed over a silicon wafer 103, as shown for example in FIG. 1c. The circumferential lip 112 can comprise a silicon step 126 having a thickness above the surface 114 of the wafer 102 of from about 10 nanometers to about 500 nanometers. The circumferential lip 112 can also comprise an insulator portion 124 on top of and even to the side of the silicon step 126, as shown for example in FIGS. 1c and 2a, and may comprise a thickness of from about 10 nanometers to about 200 nanometers. A width of the circumferential lip 112 may be from about 1 millimeter to about 5 millimeters. The circumferential lip 112 may also comprise a beveled shape, as shown for example in FIG. 2a, with surface of the lip 112 sloping downwardly at the periphery of the wafer 102, which may be the result of beveling of the wafer before the SOI transfer process.

The circumferential lip 112 can interfere with re-use of the transfer wafer 102 for subsequent SOI transfer processes, because the lip 112 can inhibit smooth and even contact between the transfer wafer and production wafer surfaces. Also, the front surface 114 of the transfer wafer 102 can comprise damaged or rough regions that require refurbishment. Accordingly, it is desirable to refurbish the transfer wafer 102 and remove the circumferential lip 112 to reclaim and prepare the transfer wafer 102 for re-use in subsequent SOI transfer processes.

Also, the transfer wafer 102 may comprise remaining side and back layers 128, 130 of insulator material, which may be desirable to remove before re-use of the transfer wafer 102. For example, in some embodiments, the transfer wafer 102 may be exposed to an etchant solution to remove one or more of the side and back layers 128, 130 of insulator material. Alternatively, one or more of the side and back layers 128, 130 of insulator material may be retained on the transfer wafer 102, and removed once removal of the circumferential lip 112 has been completed. An etchant solution capable of removing the insulator material may be an acidic solution, such as a solution of HF, having a concentration of, for example, from about 0.5% to about 10% by volume.

Masking Method

Figure 2A:
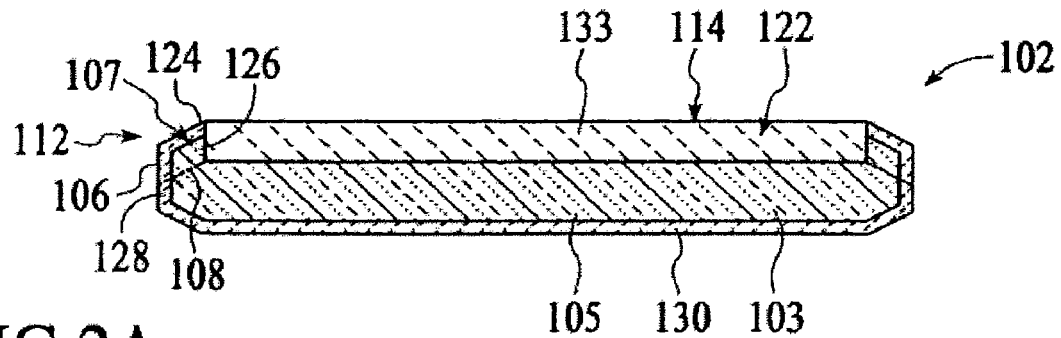
FIG. 2a is a sectional side view of an embodiment of a transfer wafer having a circumferential lip and a circular recess at least partially covered by a mask layer.

In one version, a method of removing the circumferential lip 112 comprises masking the circular recess 122 before removing the exposed circumferential lip 112. In FIG. 2a, the transfer wafer 102 is substantially absent an epitaxially grown silicon layer 104, and thus the circumferential lip 112 has a silicon step 126 comprising non-transferred silicon wafer material originating from a bare silicon wafer 103. In an alternative version, the silicon step 126 may comprise remaining material from an epitaxially grown silicon layer 104, as shown for example in FIG. 1c. In one version of the method, the circular recess 122 can be at least partially filled with a mask 133 comprising a suitable masking material. The mask 133 desirably comprises an etch resistant material, such as for example spin-on glass, which can be readily applied to the circular recess 122 and exhibits good resistance to etching solutions. Etch resistant materials can include, for example, Accuglass™ commercially available from Honeywell Electronic Materials, and Fox™ Flowable Oxide, commercially available from Dow Corning Corporation. In one version, a spin-on glass mask 133 can be formed by spin-coating a solution comprising silicon oxide suspended in a solvent onto the circular recess 122. The spin-on glass mask 133 can be annealed to planarize the mask 133, by heating to a temperature of at least about 700° C., and even at least about 900° C. Providing a planarized mask 133 promotes even masking and protection of the material underneath the masking layer.

Figure 2B:
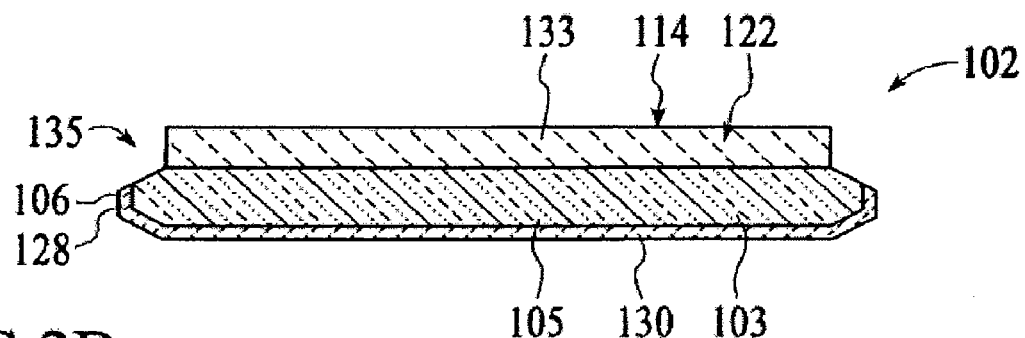
FIG. 2b is a sectional side view of the transfer wafer of FIG. 2a after removal of the circumferential lip.

Once the mask 133 has been formed, the circumferential lip 112 can be exposed to an etchant that preferentially etches away the circumferential lip 112 substantially without excessively etching the mask 133, to substantially remove the circumferential lip 112 from the transfer wafer 102, as shown for example in FIG. 2b. An example of a suitable etchant for preferentially etching the circumferential lip 112 may be a chemical solution comprising a base, such as a solution of KOH. Other examples of suitable chemical etchants may include, for example, at least one of $NH_4OH$, and tetramethyl ammonium hydroxide (TMAH). In one version, the circumferential lip 112 is removed by immersing the front face 114 of the transfer wafer 102 in a solution comprising KOH in a concentration of from about 10% to about 60% by weight, such as about 40% by weight, while maintaining the temperature of the solution at least about 50° C., such as from about 50° C. to about 80° C., and even at least about 90° C. The chemical etchant removes the circumferential lip 112 by etching the exposed lip at a rate that is faster than that at which the mask 133 is etched. Also, as the ion-implanted layer 108 extends towards the periphery of the transfer wafer 102, the circumferential lip 112 will generally be relatively loosely held on the transfer wafer 102, rendering it more readily eroded and removed than the masked regions. The circumferential lip 112 is exposed to the etching solution for a duration sufficient to substantially remove the circumferential lip 112, such as for about 30 seconds to about 5 minutes.

Figure 2C:
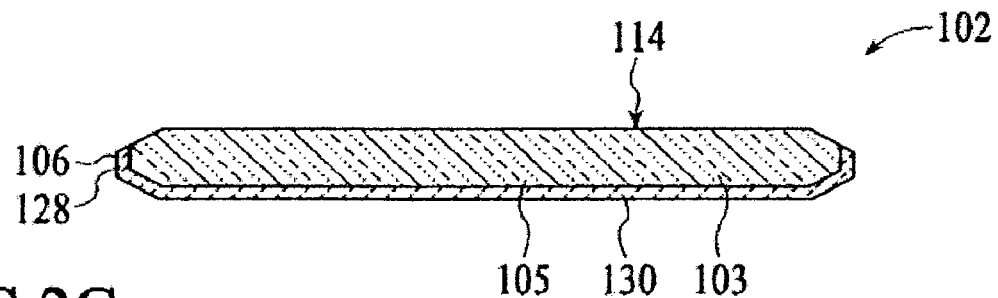
FIG. 2c is a sectional side view of the transfer wafer of FIG. 2b after removal of the mask layer.
Figure 2D:
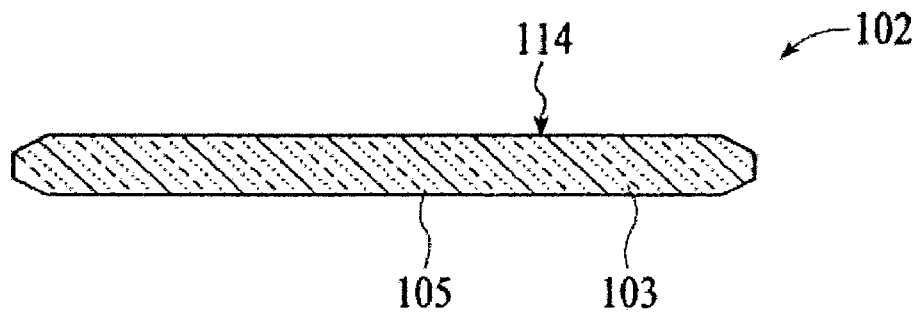
FIG. 2d is a sectional side view of the transfer wafer of FIG. 2c after removal of an insulator layer.

Once the circumferential lip 112 has been sufficiently etched, the mask 133 can be removed from the transfer wafer 102 to reveal the underlying silicon material 105, as shown for example in FIG. 2c. The mask 133 can be removed by exposing the front face 114 of the transfer wafer 102 to a chemical etchant that is capable of etching away the masking material, preferably at a rate that is higher than the rate at which the exposed peripheral region 135 of the transfer wafer 102 is etched. A suitable etchant may comprise an acidic solution, such as a solution of HF. Other suitable etchants may comprise, for example, at least one of a buffered oxide etch solution (BOE) comprising a solution of HF buffered with $NH_4F$, and a mixed etch solution (MAE), which can comprise a mixture of HF, $HNO_3$, and acetic acid. In one version, a mask 133 comprising spin-on glass is removed by immersing the front face 114 of the transfer wafer 102 in an etchant solution comprising HF at a concentration of from about 3% to about 10% by volume for a duration of from about 2 to about 10 minutes. The mask removal step provides a transfer wafer front surface 114 that is substantially absent a circumferential lip 112, as shown for example in FIG. 2c. The chemical etchant may also be capable of removing one or more of a remaining side and backside layer 128, 130 of insulator material along with the mask 133, to provide a wafer 102 that is substantially absent the insulator material, as shown for example in FIG. 2d.

Selective Etching Method

In yet another version, the circumferential lip 112 is removed by exposing the front surface 114 of the transfer wafer 102 to an etchant solution comprising a composition that is capable of preferentially etching away the circumferential lip 112 relative to the material in the circular recess 122. For example, the etchant solution may be capable of etching the ion-implanted circumferential lip 112 at a faster rate than the silicon material in the circular recess 122. The ion-implanted layer regions 108 on the periphery of the transfer wafer 102 typically have lattice damage, which can render the circumferential lip 112 over the cleaning layer 108 easier to remove with certain etchant compositions than other regions of the wafer 102. The circumferential lip 112 can be etched with a selected etchant composition until the lip 112 has been sufficiently removed, for example to provide a transfer wafer 102 having a substantially planar front surface 114, as shown in FIG. 2c.

A suitable chemical etchant for removing the circumferential lip 112 may be a basic etchant solution, such as KOH. Suitable chemical etchants may also comprise at least one of tetramethyl ammonium hydroxide (TMAH) and ethylenediamine (EDA). Desirably, the etchant solution has a base concentration and composition that is selected to preferentially etch away an ion-implanted circumferential lip 112 having an ion implanted depth of from about 100 nm to about 2 micrometers, relative to a circular recess 122 that is substantially absent ion-implantation. For example, the etchant solution may be capable of etching the ion-implanted circumferential lip 112 at a rate that is at least about 1.5 times to about 3 times the rate at which the circular recess 122 is etched. In one version, the circumferential lip 112 can be removed by exposing the front surface 114 of the transfer wafer 102 to an etchant solution comprising KOH in a concentration of from about 10% to about 60% by weight, that may be maintained at a temperature of at least about 40° C., such as from about 40° C. to about 80° C., and even at least about 90° C., for a duration of from about 30 seconds to about 3 minutes.

In one version, the front surface 114 of the transfer wafer 102 may be exposed to a solution having a composition that is selected to remove an insulator portion 124 from the top of the circumferential lip 112 to uncover a remaining silicon step portion 126 of the circumferential lip 112. For example, the front surface 114 may be immersed in a solution that selectively etches the insulator material on the front surface 114 at a higher rate with respect to the silicon material on the surface, such as for example silicon material in the circular recess 122. A suitable selective etchant may be for example an oxide removal etchant, such as for example a solution of HF in a concentration of from about 3% to about 10% by volume. In one version, a suitable wet etching tool for etching the front surface of the wafer 102 may be an Oasis wet etching tool commercially available from Applied Materials. A back layer 130 of insulator material may be retained during this etching step, for example by keeping the back surface of the transfer wafer 102 out of the etching solution that removes the front side insulator material, such that the back layer 130 is substantially not etched. A thickness of the retained backside insulator layer 130 may be from about 100 nm to about 300 nm. Once the insulator material has been removed from the front surface to reveal the silicon step portion 126 of the circumferential lip 112, the transfer wafer 102 may be immersed an etching solution that selectively etches the ion-implanted regions of the wafer 102, such as the ion-implanted silicon step portion 126 of the circumferential lip. The ion-implanted region selective etching solution can comprise at least one of the selective etching solutions described above, such as for example a solution of KOH in a concentration of from about 10% to about 60% by weight. The remaining back layer 130 of insulator material inhibits excessive etching of the back side of the transfer wafer 102, while the ion-implanted circumferential lip 112 is etched and removed by the selective etching solution. Thus, this process may extend the usable life of the transfer wafer 102 by reducing excessive etching of the back side of the transfer wafer 102.

Fine Particulate Grinding Method

In yet another version, the circumferential lip 112 can be removed by grinding the front surface 114 of the wafer 102 with relatively fine particulates. The relatively fine particulates may be capable of removing the circumferential lip 112 substantially without damaging the front surface 114 or underlying lattice structure of the transfer wafer 102. A suitable size of the particulates may be a mesh size of from about 2000 to about 8000, which corresponds to an average particle size of no larger than about 10 microns. The relatively fine particulates may be ground against the front surface 114 until the circumferential lip 112 has been substantially removed from the front surface 114 of the transfer wafer 102.

Figure 3:
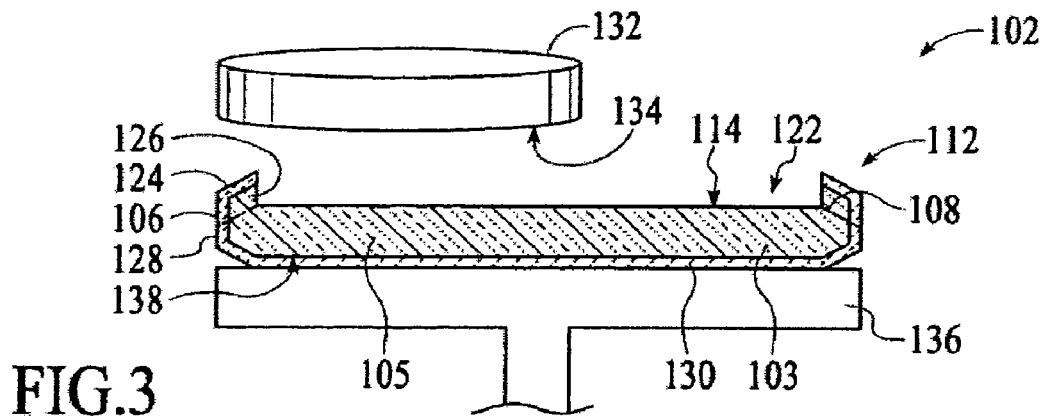
FIG. 3 is a sectional side view of an embodiment of a transfer wafer having a circumferential lip, and a grinding wheel comprising fine grinding particulates for grinding the circumferential lip.

In one version, the front surface 114 can be ground with a grinding wheel 132 having the relatively fine particulates fixed thereon, as shown for example in FIG. 3. The particulates may be on a grinding surface 134 that is pressed and rotated against the front surface 114, and in particular against the circumferential lip 112, to grind away and remove the circumferential lip 112. A suitable grinding wheel 132 may comprise for example fine particles of at least one of diamond, cubic boron nitride or other abrasive material, that is fixed onto the grinding surface 134. For example, the grinding wheel 132 can comprise fine abrasive particles that are suspended in at least one of a resin and vitrified matrix on the grinding surface 134, and may even be suspended by metal bonds on the grinding surface 134, such as for example fine grinding wheels commercially available from Saint Gobain, and Asahi Glass Co, Ltd. A polishing slurry can also be applied between the circumferential lip 112 and grinding wheel 132 to improve the removal of the lip, such as for example a slurry comprising particles of silica in a solution comprising at least one of KOH and tetramethyl ammonium hydroxide.

The transfer wafer 102 can be held on a support 136, such as a vacuum chuck, during the grinding process. The support 136 may hold the transfer wafer 102 substantially stationary while the grinding wheel 132 is rotated against the front surface 114. Alternatively, the support 136 may rotate the transfer wafer 102 against a stationary grinding surface 134, or the grinding wheel 132 and transfer wafer 102 may both be rotated, for example in opposing directions. In one version, the transfer wafer 102 is kept stationary, and a grinding wheel 132 comprising the relatively fine particles is rotated while pressing against the front surface 114 at a rate of from about 300 rpm to about 900 rpm.

It may furthermore be desirable to retain the backside layer 130 of insulator material during the grinding process, to inhibit contamination of the transfer wafer 102 by contaminant materials from the support 136. The backside layer 130 can provide a barrier layer between the support 136 and the silicon portions of the transfer wafer 102 to inhibit the diffusion of contaminant particles, such as metal support material particles, into the silicon portions of the transfer wafer 102. The backside layer 130 can also protect the wafer 102 from microscratches that can results from abrasion of the wafer 102 against the support 136. Desirably, once the backside insulator layer 130 has been removed, for example by immersing in an etching solution, the resulting back surface 138 of the transfer wafer 102 has a metal contamination level of less than about $1 \times 10^{12}$ atoms/cm$^2$, such as less than about $5 \times 10^{10}$ atoms/cm$^2$. At least one of the backside layer 130 and other portions of insulator material may be removed in a post-etching process comprising a solution of, for example, hydrofluoric acid.

Selective Grinding Method

In yet another method of refurbishing the transfer wafer 102, the circumferential lip 112 can be removed by a selective grinding process that grinds off the circumferential lip 112 on the front surface 114 of the transfer wafer substantially without grinding the circular recess 122. This method allows the circumferential lip 112 to be selected for and removed, substantially without damaging or eroding away the material in the circular recess 122. The method can provide a substantially planar front surface 114 suitable for use in subsequent SOI transfer processes.

Figure 4:
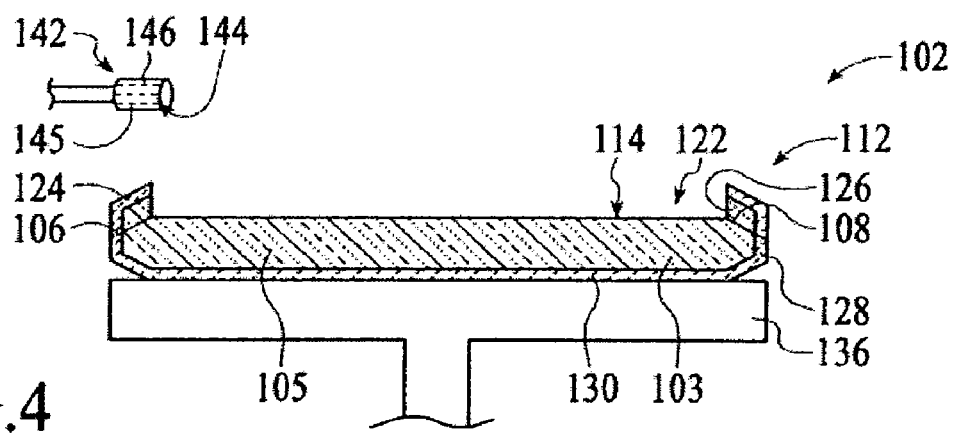
FIG. 4 is a sectional side view of an embodiment of a transfer wafer having a circumferential lip, and a grinding tool capable of selectively grinding the circumferential lip.

FIG. 4 shows an example of a selective grinding process with a grinding tool 142 that is capable of grinding off the circumferential lip 112 substantially without grinding the circular recess 122. The grinding tool 142 comprises a roughened surface 144 that grinds against the circumferential lip 112 to wear away the lip. For example, the grinding tool 142 can comprise ridges or other raised particles or features on a cylindrical grinding head 146 that grind against the circumferential lip 112. In one version, the grinding tool 142 can even comprise relatively fine particulates that are capable of relatively gently grinding the circumferential lip 112, such as particulates having a size of from about 2 micrometers to about 6 micrometers. The grinding tool 142 can be shaped and sized to selectively grind the circumferential lip 112 of the transfer wafer 102, substantially without grinding the circular recess 122. For example, the grinding tool 142 may comprise a grinding head 146 that is adapted to rotate about a circumference of the transfer wafer 102, and may comprise a grinding surface 144 having a width that is sized to extend across substantially only the circumferential lip 112.

In one version, the grinding tool 142 comprises a grinding surface 144 that is an abrasive tape 145 having abrasive particles thereon. The abrasive tape 145 can be continuously replaced on the grinding head 146 by feeding fresh tape 145 onto the grinding head 146 to maintain grinding performance. The abrasive tape 145 may also comprise a width across the grinding head 146 that is sized to accommodate the circumferential lip 112, substantially without grinding the circular recess 122. The grinding tool 142 may also comprise, for example, detection or positioning software that is adapted to determine a location of the grinding head 146 on the wafer 102 to position the grinding head 146 over the circumferential lip 112. A suitable grinding tool may comprise, for example, a 7AF nTellect grinding machine commercially available from Strasbaugh, or a NME-68 Polishing Machine commercially available from Mipox International Inc. The grinding head 146 is desirably rotated at a sufficient velocity to wear away the circumferential lip 112, substantially without inducing microcracking or other damage in the circular recess 122 on the transfer wafer 102. For example, a suitable rotational velocity of the grinding head 146 may be less than about 3500 rpm, such as from about 2500 to about 3500 rpm.

In one version, the transfer wafer 102 can be held by a support 136 during the selective grinding process. A backside insulator layer 130 may be kept on the transfer wafer 102 during the grinding process to inhibit contamination of the transfer wafer 102 from the substrate support 136. The support 136 may be a rotatable support 136 that is capable of revolving the transfer wafer 102 below the grinding tool 142 so that the circumferential lip 112 is below the grinding tool 142. In another version, the transfer wafer 102 may be held on a non-rotatable support, and the grinding tool 142 may revolve about the periphery of the transfer wafer 102 to selectively remove the peripheral lip. The grinding tool 142 and support 136 may also be capable of simultaneously revolving in the same or opposing directions during the grinding process, to provide the desired grinding characteristics.

Selective CMP Method

Figure 5:
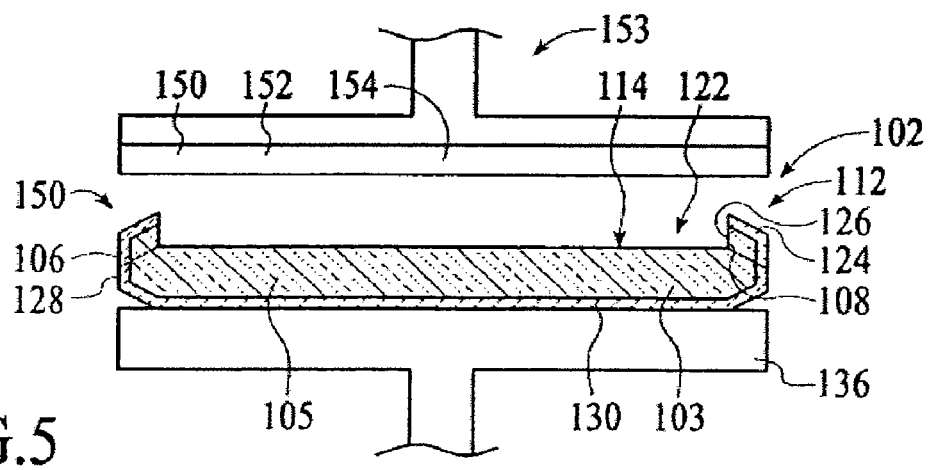
FIG. 5 is a sectional side view of an embodiment of a transfer wafer having a circumferential lip, and a polishing pad capable of maintaining a higher pressure at an edge of the pad to grind away the circumferential lip.
Figure 6:
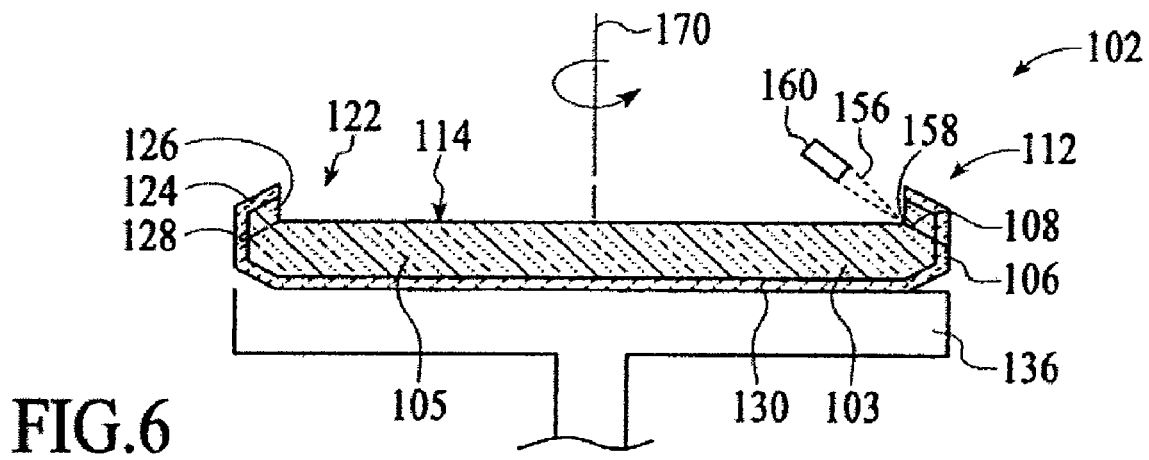
FIG. 6 is a sectional side view of an embodiment of a transfer wafer having a circumferential lip, and a fluid jet nozzle capable of directing a fluid jet stream at a base of the circumferential lip to etch away the circumferential lip.

In yet another method, the circumferential lip 112 may be removed by an improved chemical mechanical polishing method that comprises rotating the front surface 114 of the transfer wafer 102 against a polishing pad 152, while applying a higher pressure to a peripheral edge 150 of the pad 152 above the circumferential lip 112 of the transfer wafer 102, relative to a pressure maintained at a central pad region 154 above the circular recess 122, as shown for example in FIG. 5. The differential in pressure allows for the circumferential lip 112 to be preferentially polished from the transfer wafer 102 at a higher rate, substantially without excessively polishing the circular recess 122. For example, the pressure applied to the peripheral edge 150 of the polishing pad 152 may be at least about 14 kPa (2 pounds-per-square-inch) greater, and even at least about 34 kPa (5 PSI) greater than the pressure applied at the central pad region 154. In one version, the pressure applied to the peripheral edge 150 is from about 7 kPa (1 PSI) to about 83 kPa (12 PSI), such as about 55 kPa (8 PSI), and the pressure applied to the central pad region 154 may be from about 3 kPa (0.5 PSI) to about 34 kPa (5 PSI), such as about 14 kPa (2 PSI). A suitable polishing head 153 that is capable of applying different pressures to the pad 152 may comprise the Titan Head, Titan Profiler Head, and Contour Head, commercially available from Applied Materials, Inc. A suitable pad 152 may comprise a polyurethane pad.

A polishing slurry can also be applied between the transfer wafer 102 and polishing pad 152 during the polishing process. The polishing slurry may be capable of both chemically and physically eroding the circumferential lip 112 to remove the lip from the transfer wafer 102. For example, the polishing slurry can comprise slurry particles in a chemical etchant, such as at least one of KOH and NH$_4$OH. The slurry particles can comprise at least one of fumed and colloidal silicon, and may have a specific surface area of from about 50 m$^2$/gram to about 200 m$^2$/gram. In one version, the polishing slurry is preferentially applied between the peripheral edge 150 of the pad and the circumferential lip 112 of the transfer wafer 102 to polish away the circumferential lip 112, substantially without excessively eroding or damaging the material in the circular recess 122. As an alternative to applying different pressures to a polishing pad 152, in another version, the pad 152 is formed of a material that is relatively inflexible. The pad 152 may be sufficiently inflexible such that when the pad 152 is pressed against the circumferential lip 112 of the wafer 102, the central region 154 of the pad 152 substantially does not bend or deform into the circular recess 122 of the wafer 102, and thus grinding and removal of material from the recess 122 is substantially inhibited. The relatively inflexible and hard polishing pad 152 thus provides for selective removal of the circumferential lip 112 substantially without grinding or removing other portions of the wafer 102. A suitable polishing pad may comprise, for example, a Rodel™ MH polishing pad or a Rodel Suba™ 1200, both of which are commercially available from Rodel, U.S.A.

During the selective polishing process, the transfer wafer 102 can be held on a support 136 that is capable of rotating the wafer 102 against the polishing pad 152. Alternatively, the support 136 may be non-rotatable, and the polishing pad 152 may rotate to polish the wafer 120, or the support 136 and pad 152 can both be rotatable. Desirably, the backside insulator layer 130 is retained during the polishing process to inhibit contamination of the wafer 102 by contaminant materials from the wafer support 136.

Fluid Jet Spraying Method

In yet another method, the circumferential lip 112 can be removed by directing a fluid jet 156 at a base 158 of the circumferential lip 112 to etch away the circumferential lip 112. The fluid jet 156 can comprise, for example, a jet of pressurized water that is aimed at the base 158 of the circumferential lip 112, in the area of the ion implanted layer 108, to loosen portions of the circumferential lip 112 from the transfer wafer 102. The fluid jet 156 can widen and propagate microcracks and voids in the layer 108, to break off the circumferential lip 112 from the transfer wafer 102. The fluid jet 156 comprises a pressure that is sufficiently high to remove the circumferential lip 112, such as for example a pressure of from about 690 kPa (100 PSI) to about 13790 KPa (2000 PSI), such as at about 1379 kPa (200 PSI). The fluid jet 156 can be directed towards the transfer wafer 102 at an angle of from about 5° to about 40° with respect to a normal 170 to the front surface 114, such as at an angle of about 20°, to remove the circumferential lip 112.

In one version, one or more of the fluid jet 156 and the transfer wafer 102 may be rotated while the fluid jet 156 is directed towards the base 158 of the circumferential lip 112. The rotation allows the circumferential lip 112 to be loosened from the transfer wafer 102 on all sides, improving the overall lip removal efficiency. The fluid jet 156 can be rotated, for example, by a robot arm (not shown) that is capable of rotating a fluid jet nozzle 160 in a circular path over the transfer wafer 102. The transfer wafer 110 can be rotated by placing the wafer 102 on a rotatable support 136. In this version, the transfer wafer 102 desirably retains a backside layer 130 of insulator material to inhibit contamination of the transfer wafer 102. A suitable rotation speed for at least one of the fluid jet 156 and transfer wafer 102 can be a speed of from about 10 rpm to about 500 rpm, such as about 100 rpm. The fluid jet removal method desirably removes substantially the entire circumferential lip 112, substantially without excessively etching or damaging the circular recess 122.

Once the circumferential lip 112 has been removed from the transfer wafer 102 by any of the processes, one or more subsequent chemical mechanical polishing processes can be performed to polish and planarize at least one of the front surface 114 and back surface 138 of the transfer wafer 102. The chemical mechanical polishing process can also remove any remaining portions of the back or side insulator layers 130, 128, such as a backside insulator layer 130 that was retained to inhibit contamination of a wafer 102 being held on a support 136. A suitable chemical mechanical polishing process can comprise applying a polishing slurry between a polishing pad and the desired surface of the transfer wafer 102, and rotating the desired surface against a polishing pad. For example, the polishing slurry can comprise at least one of fumed and colloidal silicon in a solution of at least one of KOH and $NH_4OH$. Additionally or alternatively, the backside and any side insulator layers 130, 128, can be removed by etching away the layers, for example with an acidic chemical solution comprising HF.

The refurbished transfer wafer 102 desirably comprises a substantially planar front surface 114 that is substantially absent the circumferential lip 112, and is even substantially absent any small edge roll-off or edge bumper rings, which may be in the 0.1 nanometer size range. The transfer wafer 102 is also desirably absent metal contamination that could affect the electrical properties of the processed production wafer, for example, the transfer wafer 102 may comprise a metal concentration level of less than about $1 \times 10^{12}$ atoms/$cm^2$. The refurbished transfer wafer 102 can be re-processed, for example by performing an ion-implantation step and insulator layer formation step, to form an SOI structure that can be transferred to a production wafer 110, as in FIGS. 1a through 1c. The improved SOI transfer wafer 102 that is refurbished to provide the substantially planar front surface 114 provides improved results in the formation of SOI structures on production wafers 110. For example a SOI transfer wafer refurbished according to the described methods may be capable of providing at least about a 1%, and even at least about a 20% increase in the production wafer yield.

In one version, a front surface polishing process, such as one of the refurbishing and polishing methods described above, is performed to polish the front surface 114 of the wafer 102, substantially without polishing the back surface 138 of the transfer wafer 102. For example, in one version, a transfer wafer 102 that has had the circumferential lip 112 removed is inspected by a metrology method, and the side surface of the wafer 102 is polished. A single side polishing step is then performed to polish the front surface 114 of the wafer 102, substantially without polishing the back surface 138 of the wafer. The polishing process used in any of the steps may be, for example, a chemical mechanical polishing process. The polished wafer 102 can be inspected, subjected to further metrology, and may undergo further cleaning processes. In contrast, some polishing processes typically polish both the front surface 114 and back surface 138 of the wafer 102, typically simultaneously. This double-sided polishing process in which both the front and back surfaces 114, 138 of the wafer 102 are polished, typically provides a relatively high removal rate of material from the wafer 102, and thus has been considered to be an efficient means of refurbishing the transfer wafer 102. However, such double sided polishing methods also typically remove an undesirably large amount of material, reducing the number of times the transfer wafer 102 can be used for SOI transfer processes. By providing a method that is capable of efficiently polishing a front surface 114 of the wafer 102 substantially without requiring polishing of the back surface 138, such as the refurbishing and polishing methods described above, the front surface 114 of the SOI transfer wafer 102 can be efficiently refurbished without excessive loss of substrate material.

To illustrate the improved process, FIG. 8a shows the steps of an embodiment of a refurbishment method having a double-sided polishing step, and FIG. 8b shows the steps of an embodiment of an improved refurbishment process having a single-sided polishing step. In FIG. 8a, a SOI transfer wafer 102 is first subjected to an incoming inspection and metrology of the wafer 102. The edge 118 of the wafer 102 is polished to remove any excess insulator material from the edge 118, and an edge polish cleaning step is performed to clean the wafer 102 after the edge polish. A double-sided polishing step, such as a chemical mechanical polishing step, is then performed to simultaneously polish the front and back surfaces 114, 138 of the transfer wafer 102 at a relatively high rate. After a desired amount of material has been removed, a post-polishing cleaning step is performed to clean the transfer wafer 102, and the wafer is inspected to determine the extent of refurbishment. A single-sided polishing step, using a conventional polishing method, may be performed to provide a slow removal of remaining undesired material, followed by post cleaning, metrology and final cleaning steps, before shipping of the refurbished transfer wafer 102.

In contrast, FIG. 8b illustrates an efficient method of refurbishing the transfer wafer 102 with a single-sided polishing process. In this method, the transfer wafer 102 is subjected to an incoming inspection and metrology, and an edge polishing step to remove a remaining edge insulator layer can be performed. A single-sided polishing step is performed to polish the front surface 114 of the wafer 102 to substantially remove the circumferential lip 112 from the surface 114, for example by one of the methods described above. For example, the single sided polishing process may comprise a chemical mechanical polishing method in which a higher pressure is applied by the polishing pad on the circumferential lip 112 than above the circular recess 122. As another example, the single-sided polishing process can comprise removing the circumferential lip 112 by at least one of a selective grinding method, fine particulate grinding method, masking method, selective etching method, and fluid jet spraying method, optionally followed by chemical mechanical or other polishing method to polish the front surface 114. Once the front surface 114 has been polished, the transfer wafer 102 is inspected, metrology is performed, and the wafer is cleaned in a final cleaning process before shipping the transfer wafer 102. Thus, the improved refurbishment and polishing method provides an efficient refurbishment method with fewer steps than the embodiment shown in FIG. 8a, and also does not remove an excessive amount of substrate material, at least in part by virtue of the absence of a back side polishing step. The improved efficiency and reduced waste of the method allows for the transfer wafer 102 to be more efficiently recycled and refurbished a greater number of times.

Figure 7A:
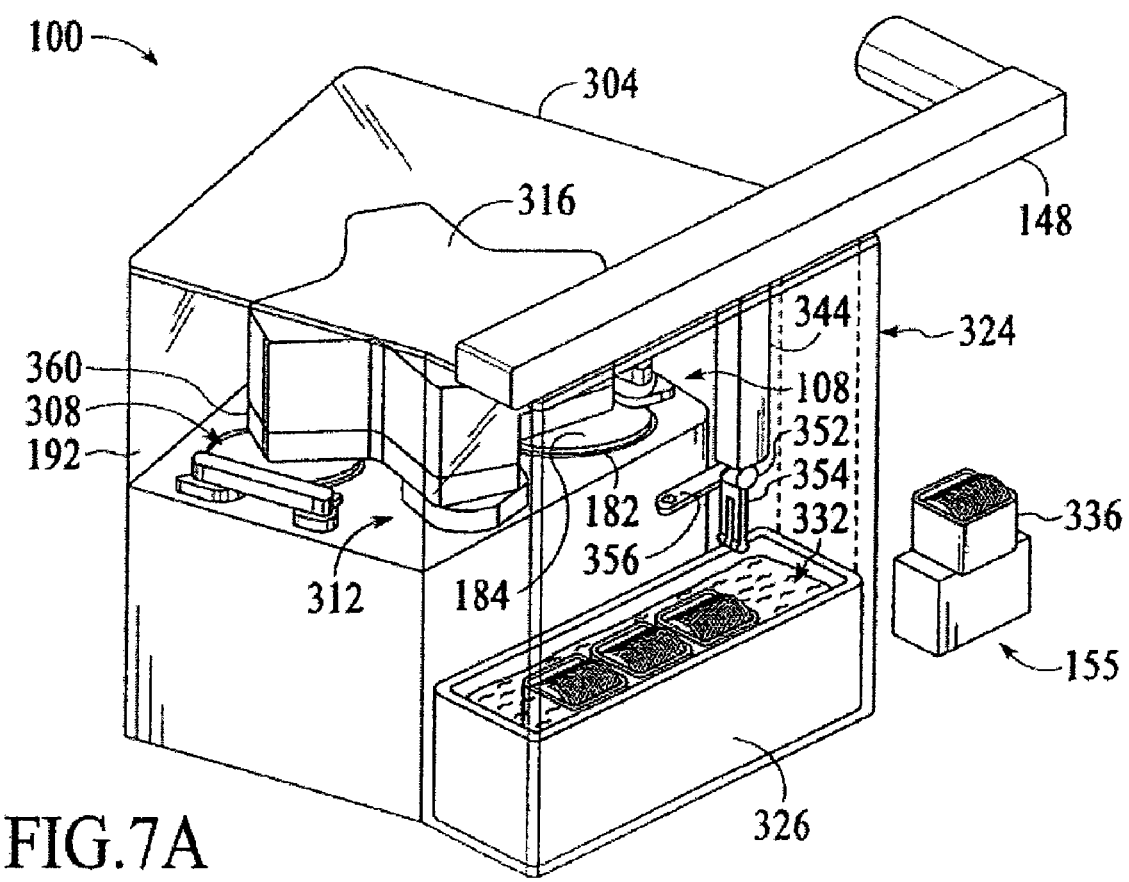
FIG. 7a is a perspective view of a chemical mechanical polisher capable of polishing a transfer wafer.
Figure 7B:
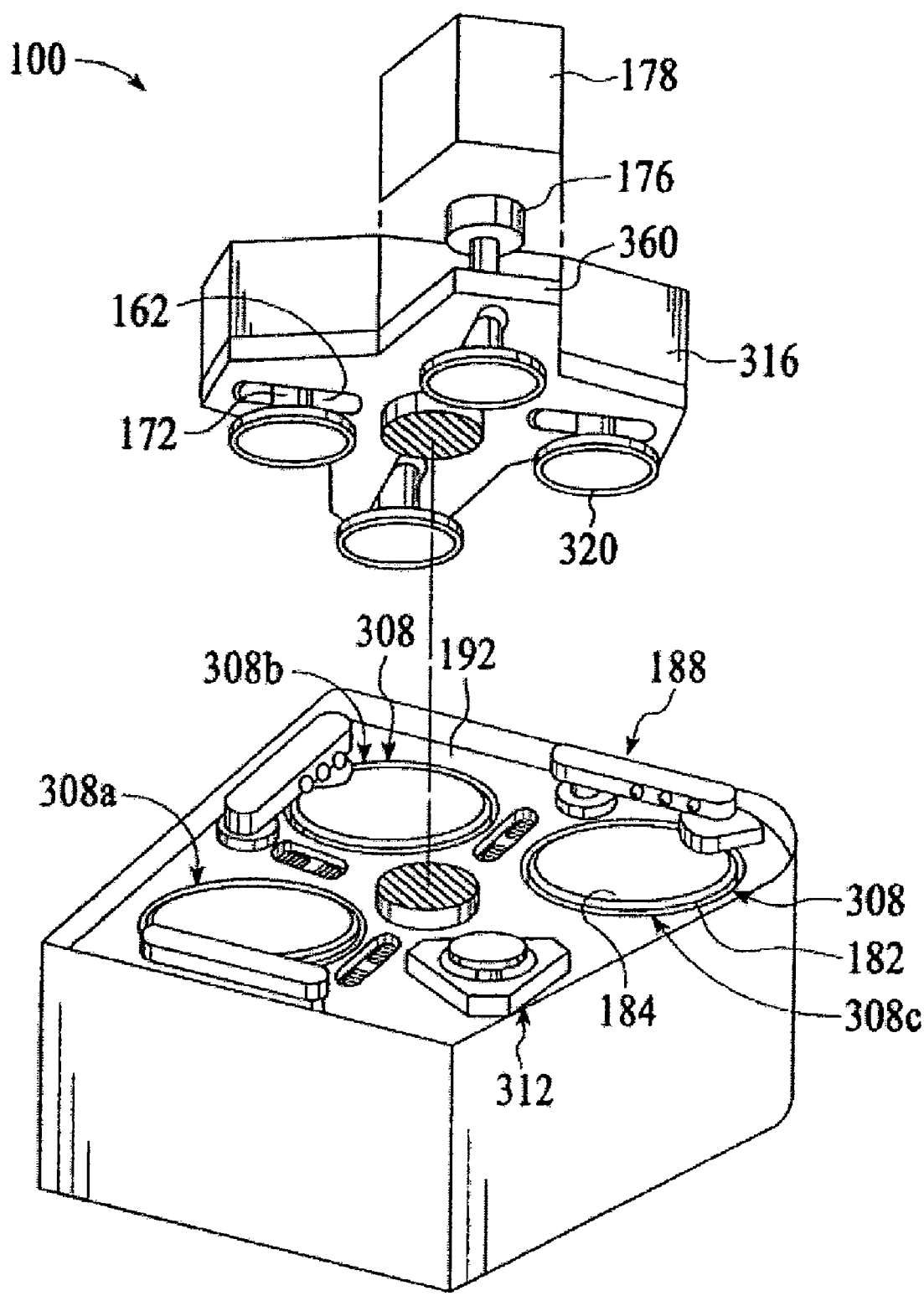

An embodiment of a chemical mechanical polishing apparatus 100 that is suitable for polishing one or more sides of the transfer wafer 102, is shown in FIGS. 7a through 7c. The apparatus 100 may be suitable for polishing the wafer 102 after removal of the circumferential lip 112, and may also be used to polish the wafer 102 before or during the lip removal process. Generally, the polishing apparatus 100 includes a housing 304 containing multiple polishing stations 308, a wafer transfer station 312, and a rotatable carousel 316 that can operate independently rotatable wafer holders 320. A wafer loading apparatus 324 includes a tub 326 that contains a liquid bath 332 in which cassettes 336 containing wafers 102 are immersed, and is attached to the housing 304. For example, the tub 326 can include cleaning solution or can even be a megasonic rinsing cleaner that uses ultrasonic sound waves to clean the wafer 102 before or after polishing, and a dryer could also be provided. An arm 344 rides along a linear track 148 and supports a wrist assembly 352, which includes a cassette claw 354 for moving cassettes 336 from a holding station 155 into the tub 326 and a wafer blade 356 for transferring wafers from the tub 326 to the transfer station 312.

The carousel 316 has a support plate 360 with slots 162 through which the shafts 172 of the wafer holders 320 extend, as shown in FIG. 7b. The wafer holders 320 can independently rotate and oscillate back-and-forth in the slots 162 to achieve a uniformly polished wafer surface. The wafer holders 320 are rotated by respective motors 176, which are normally hidden behind removable sidewalls 178 of the carousel 316. In operation, a wafer 102 is loaded from the tub 326 to the transfer station 312, from which the wafer is transferred to a substrate holder 320 where it is initially held by vacuum. The carousel 316 then transfers the wafer 102 through a series of one or more polishing stations 308 and finally returns the polished wafer 102 to the transfer station 312.

Each polishing station can 308a-c include a rotatable platen 182, which supports a polishing pad 184, and a pad conditioning assembly 188, as shown in FIG. 7b. The platens 182 and pad conditioning assemblies 188 are both mounted to a table top 192 inside the polishing apparatus 100. During polishing, the wafer holder 102 holds, rotates, and presses a wafer 102 against a polishing pad 184 affixed to the rotating polishing platen 182, which also has a retaining ring encircling the platen 182 to retain a wafer 102 and prevent it from sliding out during polishing of the wafer 102. As a wafer 102 and polishing pad 184 are rotated against each other, measured amounts of a polishing slurry are supplied according to a selected slurry recipe, for example the polishing slurry can comprise, deionized water with colloidal silica or alumina. Both the platen 182 and the wafer holder 320 can be programmed to rotate at different rotational speeds and directions according to a process recipe. The polishing apparatus 100 can be used to remove a desired amount of material from the wafer 102, such as an amount of a remaining insulator layer, as well as to polish and planarize surfaces of the transfer wafer 102 to render the wafer suitable for re-processing and further SOI transfer processes. The typical operation and general features of the polishing apparatus 100 are further described in commonly assigned U.S. Pat. No. 6,200,199 B1, filed Mar. 31$^{st}$, 1998 by Gurusamy et al., which is hereby incorporated by reference herein in its entirety.

The present invention has been described with reference to certain preferred versions thereof; however, other versions are possible. For example, the transfer wafer 102 can comprise transferable structures other than the SOI structure. Other embodiments and configurations of the CMP polisher can also be used to refurbish the transfer wafer 102. Further, alternative steps equivalent to those described for the refurbishment method can also be used in accordance with the parameters of the described implementation, as would be apparent to one of ordinary skill. Therefore, the spirit and scope of the appended claims should not be limited to the description of the preferred versions contained herein.

What is claimed is:

1. A method of refurbishing a silicon-on-insulator transfer wafer having a first surface, a second surface opposing the first surface, and an edge extending between the surfaces, the method comprising:
   polishing the edge of the silicon-on-insulator transfer wafer to remove excess material;
   simultaneously polishing the first and second surfaces of the silicon-on-insulator transfer wafer; and
   further polishing the first surface of the silicon-on-insulator transfer wafer to remove additional material from the first surface of the transfer wafer and provide sufficient smoothness for providing a refurbished first surface for the wafer.

2. The method of claim 1 wherein the simultaneous polishing comprises a double-sided polishing process, and the further polishing comprises a single-sided polish process.

3. The method of claim 1 which further comprises:
   inspecting the silicon-on-insulator transfer wafer and performing a metrology process on the silicon-on-insulator transfer wafer prior to polishing of the edge.

4. The method of claim 1 which further comprises cleaning the silicon-on-insulator transfer wafer after polishing the edge and prior to the simultaneous polishing.

5. The method of claim 1 wherein the simultaneous polishing is conducted at a first polishing rate, the further polishing is conducted at a second polishing rate that is higher than the first polishing rate.

6. The method of claim 1 wherein the simultaneous polishing comprises a chemical mechanical polishing step.

7. The method of claim 1 which further comprises inspecting the silicon-on-insulator transfer wafer after the further polishing to confirm that the refurbished first surface is achieved.

8. The method of claim 1 which further comprises:
performing a metrology process on the silicon-on-insulator transfer wafer and cleaning the silicon-on-insulator transfer wafer after the further polishing.

9. A method of refurbishing a silicon-on-insulator transfer wafer having a first surface, a second surface opposing the first surface, and an edge extending between the surfaces, the method comprising:
polishing the edge of the silicon-on-insulator transfer wafer to remove excess material;
simultaneously polishing the first and second surfaces of the silicon-on-insulator transfer wafer with a double-sided polishing process; and
further polishing the first surface of the silicon-on-insulator transfer wafer with a single-sided polish process to remove additional material from the first surface of the transfer wafer and provide sufficient smoothness for providing a refurbished first surface for the wafer;
wherein the simultaneous polishing is conducted at a first polishing rate, the further polishing is conducted at a second polishing rate that is higher than the first polishing rate.

10. The method of claim 9 which further comprises inspecting the silicon-on-insulator transfer wafer and performing a metrology process on the silicon-on- insulator transfer wafer prior to polishing of the edge.

11. The method of claim 9 which further comprises cleaning the silicon-on-insulator transfer wafer after polishing the edge and prior to the simultaneous polishing.

12. The method of claim 9 wherein the simultaneous polishing comprises a chemical mechanical polishing step.

13. The method of claim 9 which further comprises inspecting the silicon-on-insulator transfer wafer after the further polishing to confirm that the refurbished first surface is achieved.

14. The method of claim 9 which further comprises:
performing a metrology process on the silicon-on-insulator transfer wafer and cleaning the silicon-on-insulator transfer wafer after the further polishing.

* * * * *